(12) United States Patent
Shindo

(10) Patent No.: US 6,627,559 B2
(45) Date of Patent: Sep. 30, 2003

(54) COATING FILM

(75) Inventor: Toyohiko Shindo, Tokyo (JP)

(73) Assignee: Contamination Control Services ( * ) Notice: Subject to any disclaimer, the term of this patent is extended or adjusted under 35 U.S.C. 154(b) by 8 days.

(21) Appl. No.: 09/911,300

(22) Filed: Jul. 23, 2001

(65) Prior Publication Data
US 2002/0034885 A1 Mar. 21, 2002

(30) Foreign Application Priority Data

Jul. 27, 2000 (JP) ........................ P2000-227036
Mar. 28, 2001 (JP) ........................ P2001-094125

(51) Int. Cl.[7] .......................................... H01L 21/469
(52) U.S. Cl. ................. 438/780; 438/790; 438/787; 438/789; 428/427; 428/446; 428/450; 427/579; 427/458
(58) Field of Search ................. 438/780, 781, 438/787, 789, 790; 428/427, 446, 447, 448, 450, 451; 427/579, 578, 458

(56) References Cited

U.S. PATENT DOCUMENTS

| | | | | |
|---|---|---|---|---|
| 3,911,169 A | * | 10/1975 | Lesaicherre et al. | 427/96 |
| 4,689,252 A | * | 8/1987 | Lebrun et al. | 427/228 |
| 4,840,778 A | * | 6/1989 | Arai et al. | 423/324 |
| 5,114,749 A | * | 5/1992 | Nishio et al. | 427/226 |
| 5,750,628 A | * | 5/1998 | Becker et al. | 528/25 |
| 5,770,260 A | * | 6/1998 | Fukuyama et al. | 427/226 |
| 6,232,216 B1 | * | 5/2001 | Machida et al. | 438/624 |
| 6,479,399 B2 | * | 11/2002 | Park et al. | 438/738 |
| 6,479,405 B2 | * | 11/2002 | Lee et al. | 438/782 |
| 6,489,252 B2 | * | 12/2002 | Goo et al. | 438/758 |

FOREIGN PATENT DOCUMENTS

| | | | | |
|---|---|---|---|---|
| JP | | 5345983 | 12/1993 | |
| JP | | 11060957 A | * 3/1999 | ........... C08L/83/14 |

* cited by examiner

Primary Examiner—Matthew Smith
Assistant Examiner—Renzo N. Rocchegiani
(74) Attorney, Agent, or Firm—Thomas W. Flynn; Wood Herron & Evans

(57) ABSTRACT

The present invention provides a coating film, which is not likely to cause cracks on the coated surface and is also capable of improving the resistance of the coated surface, especially oxidation resistance, corrosion resistance, and gas permeation resistance, a member provided with the coating film, and a method for producing the coating film. In the coating film of the present invention, a dense layer containing silicon dioxide as a principal component, which is obtained by heat-treating a solution containing perhydropolysilazane and polyorganosilazane, a ratio of the content of perhydropolysilazane to the total amount of polysilazane including perhydropolysilazane and polyorganosilazane being from 0.65 to 0.95, in air or air containing water vapor, was formed on the surface of a stainless steel plate. According to the present invention, it becomes possible to prevent cracks from occurring on the surface of the base and to prevent oxidation due to a high-concentration acidic substance, and thus the corrosion resistance and gas permeation resistance can be prevented.

14 Claims, 2 Drawing Sheets

COATING FILM

BACKGROUND OF THE INVENTION

1. Field of the Invention

The present invention relates to a coating film and a member provided with the coating film, and to a method of producing the coating film. More particularly, the present invention is directed to a coating film, which is not likely to cause cracks as a result of relief of stress caused by a difference in thermal expansion coefficient with the base or deformation, and also has improved resistance of the coated surface, especially oxidation resistance, corrosion resistance and gas permeation resistance, a member provided with the coating film, and a method of producing the coating film.

2. Background Technology

In processes of manufacturing semiconductor devices such as IC, LSI, VLSI, et al, various semiconductor manufacturing apparatuses have hitherto been used to carry out various processes, for example, heating processes, etching processes, oxidation processes, film forming processes (using CVD, PVD, or plasma CVD processes), sputtering processes, and ion implantation processes.

In these semiconductor manufacturing apparatuses, corrosive gases and corrosive liquids are frequently used in the manufacturing processes. Therefore, a metal member to be contacted with these corrosive substances is likely to be corroded, causing not only particulate contaminants to be generated, but also contamination of the apparatus due to metal impurities contained in the metal member, and thus defects in semiconductor wafers are likely to be caused by this contamination. For example, since corrosive gases such as hydrogen chloride and hydrogen bromide gases are used in a dry etching process, it was necessary to use a material having corrosion resistance as a material for the metal member, such as iron and aluminum, used in the etching system.

As the metal material of the semiconductor manufacturing apparatus, stainless steel is used in place of iron which has conventionally been used. Alternatively, the surface of stainless steel is electropolished and a passive film ($Cr_2O_3$) is further formed thereon. SUS316L having excellent corrosion resistance among stainless steels is also used; however, it does not always have satisfactory corrosion resistance in the environment of semiconductor manufacturing apparatuses.

Although the surface thereof is also coated with a fluororesin, the film coated with the fluororesin contains a trace amount of metal impurities, thereby causing contamination with impurities. Furthermore, the fluororesin could not be applied to the semiconductor manufacturing apparatus for processing at high temperatures higher than the temperature at which the fluororesin can withstand because the service temperature of the fluororesin is limited.

With respect to the portion where aluminum is used as the metal material of the semiconductor manufacturing apparatus, a trial of anodizing the surface was also made to enhance the surface corrosion resistance. However, since a large number of micropores exist on the surface of the anodized aluminum member, raw gases are adsorbed into the micropores and are then released in subsequent steps, and thus a deleterious influence is likely to be exerted in the subsequent steps. Micropores on the surface make it difficult to wash out stains, thereby causing contamination with impurities.

As the method for rust prevention of the metal used under high-temperature conditions, for example, a trial of improving the high-temperature corrosion resistance by coating the surface of the metal member with a thermal decomposition product of polysilazane was also made (Japanese Patent Application, First Publication No. Hei 5-345983).

According to this method, a metal member is coated with a film having excellent corrosion resistance or a film having excellent high-temperature oxidation resistance by coating the surface of the metal member with perhydropolysilazane or polyorganosilazane and heating to 100 to 600° C., thereby converting perhydropolysilazane or polyorganosilazane into a silica glass film.

A dense coating film can be obtained by coating the surface of the metal member with perhydropolysilazane and heat treating it in air. A flexible coating film can be obtained by coating the surface of the metal member with polyorganosilazane and heat treating it in air.

In addition, since a simple substance of perhydropolysilazane or polyorganosilazane is coated in the form of a single layer in the method of coating the surface of the metal member with the thermal decomposition product of polysilazane, a coating film which is both dense and flexible was difficult to obtain, although a dense coating film or a flexible coating film can be obtained.

In the case of a stainless steel chamber, a coating film containing silicon dioxide as a principal component is formed on the inner surface of the chamber by coating the inner surface of the chamber with perhydropolysilazane and heat treating it in air to impart the oxidation resistance to the inner surface. To cover the unevenness of the inner surface and to improve the oxidation resistance, it is necessary to form a coating film which is as dense as possible and is also thick.

However, if the thickness of the coating film is increased, films overlap with each other or a coating solution is accumulated, and thus the resulting coating film has a local thick portion, and defects such as cracks and deformation are likely to occur during the following heat treatment. The thickness of the coating film must be entirely reduced and is limited to about 1.5 to 2 $\mu$m at most.

The film obtained from perhydropolysilazane is a film which is dense and has excellent corrosion resistance. In the case of coating the surface of the metal such as stainless steel with perhydropolysilazane and heat treating, a difference in the thermal expansion coefficient between the film that was obtained by heat treating the perhydropolysilazane and the metal as a raw material causes stress in the film, and thus defects such as pinholes, cracks and microcracks are likely to occur.

In the case in which the surface of the metal includes defects such as sharp scratches, pinholes and deep irregularities, the surface of the metal cannot be covered if the thickness of the coating film is not increased. However, when the thickness is increased, defects such as pinholes, cracks, and microcracks occur in the film as compared with the case in which the film is thin. As described above, defects in the film promote corrosion in the metal provided with the coating film, resulting in poor corrosion resistance.

To eliminate the defects in the film, the film may be made thin. If the film is made thin, it becomes impossible to completely cover the surface of the metal, resulting in poor corrosion resistance.

Furthermore, it is difficult to form the preheat-treatment coating film at acutely angled portions of the metal member, for example, at the end faces and sharply scratched portions, and to form a uniform silica glass film.

The silica glass film using known polysilazane was an insufficient countermeasure for preventing the corrosion when used under such severe conditions as a high-temperature corrosive atmosphere like in the semiconductor manufacturing apparatuses.

SUMMARY OF THE INVENTION

The present invention has been made to solve the problems described above, and an object of the present invention is to provide a coating film, which is not likely to cause cracks and is also capable of improving the resistance of the coated surface, especially oxidation resistance, corrosion resistance and gas permeation resistance, a member provided with the coating film, and a method of producing the coating film.

To solve the problems described above, a coating film and a member provided with the same, and a method of producing the coating film were employed in the present invention.

The coating film of the present invention comprises: a dense layer containing silicon dioxide as a principal component, which is obtained by heat-treating a solution containing perhydropolysilazane and polyorganosilazane, a ratio of the content of perhydropolysilazane to the total amount of polysilazane including perhydropolysilazane and polyorganosilazane being from 0.65 to 0.95.

According to this coating film, it becomes possible to prevent cracks from occurring at the surface of the base and to prevent oxidation due to a high-concentration acidic substance. In addition to the oxidation resistance, the corrosion resistance and gas permeation resistance can also be improved.

The coating film may further comprise a second layer containing silicon dioxide as a principal component formed on the dense layer, the second layer being obtained by heat-treating a second solution containing perhydropolysilazane and polyorganosilazane, the content of polyorganosilazane being greater than that of the solution.

Another coating film of the present invention is a coating film formed on at least a portion of a base, comprising: a dense layer containing silicon dioxide as a principal component, which is obtained by heat-treating a solution containing perhydropolysilazane and polyorganosilazane, a ratio of the content of perhydropolysilazane to the total amount of polysilazane including perhydropolysilazane and polyorganosilazane being from 0.95 to 1.0; and a second layer containing silicon dioxide as a principal component formed on the dense layer, the second layer being obtained by heat-treating a second solution containing perhydropolysilazane and polyorganosilazane, the content of polyorganosilazane being larger than that of the solution.

According to this coating film, since the second layer is formed on the dense layer, cracks in the dense layer can be prevented from occurring. Since the surface of the base was coated with the dense layer, oxidation due to a high-concentration acidic substance can be prevented. In addition to the oxidation resistance, the corrosion resistance and gas permeation resistance can also be improved.

The coating film may further comprise a third layer containing silicon dioxide as a principal component formed on the second layer, the third layer being obtained by heat-treating a third solution containing perhydropolysilazane and polyorganosilazane, the content of polyorganosilazane being less than that of the second layer.

Still another coating film of the present invention is a coating film formed on at least a portion of a base, comprising: a flexible layer containing silicon dioxide as a principal component, which is obtained by heat-treating a solution containing perhydropolysilazane and polyorganosilazane, a ratio of the content of perhydropolysilazane to the total amount of polysilazane including perhydropolysilazane and polyorganosilazane being from 0 to 0.65; and a second layer containing silicon dioxide as a principal component formed on the flexible layer, the second layer being obtained by heat-treating a second solution containing perhydropolysilazane and polyorganosilazane, the content of polyorganosilazane being less than that of the solution.

According to this coating film, it is made possible to impart flexibility to the coating film and to relieve stress caused by a difference in thermal expansion coefficient with the base or deformation. Since the flexible layer can be made thicker, stress can be relieved more effectively.

The flexible layer and/or the second layer may comprise a laminate of plural layers containing silicon dioxide as a principal component obtained by separately heat-treating plural solutions having different contents of polyorganosilazane.

The coating film may further comprise an adhesion improved layer formed between the base and the flexible layer.

The member of the present invention is a member made of metal, ceramic, or a synthetic resin, comprising the coating film of the present invention formed on at least a portion of the surface thereof.

According to this member, it is made possible to prevent cracks from occurring at the surface of the member and to prevent oxidation of the member due to a high-concentration acidic substance. In addition to the oxidation resistance, the corrosion resistance and gas permeation resistance can also be improved.

The method of producing a coating film of the present invention comprises: coating at least a portion of the surface of a base with a solution containing perhydropolysilazane and polyorganosilazane, each content being adjusted to a predetermined value, and heat-treating the solution in air or air containing water vapor to form a dense or flexible layer containing silicon dioxide as a principal component.

According to this method, it becomes possible to easily form a coating film on at least a portion of the surface of the base without a fear of cracks and a fear of oxidation due to a high-concentration acidic substance, and without using a special apparatus. Also, it becomes possible to reduce the cost of the resulting product because the apparatus is relatively inexpensive and the processes simple.

As described above, the present invention can provide a coating film which is not likely to cause cracks in the coated surface and is also capable of improving the resistance of the coated surface, especially oxidation resistance, corrosion resistance, and gas permeation resistance.

Also, the present invention can provide a member made of metal, ceramic, or a synthetic resin, provided with the coating film.

Also, the present invention can provide a method of producing the coating film, and is capable of easily forming the coating film of the present invention without using a special apparatus, reducing the cost of the resulting product.

DESCRIPTION OF PREFERRED EMBODIMENTS

The embodiments of the coating film, the member provided with the coating film, and the method of producing the coating film according to the present invention will be described with reference to the accompanying drawings.

In the specification, the present invention will be described with reference to chambers of various systems such as etching systems, CVD systems, PVD systems, plasma CVD systems, sputtering systems, and ion implanters, which are preferably used in the semiconductor manufacturing process; however, the present invention is not limited thereto.

First Embodiment

Figure 1:
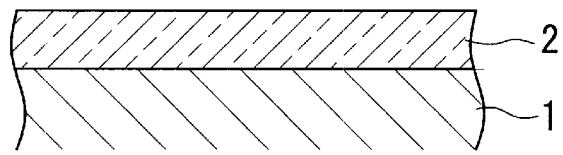
FIG. 1 is a partial cross sectional view showing a stainless steel chamber provided with the coating film according to the first embodiment of the present invention.

FIG. 1 is a partial cross sectional view showing a stainless steel chamber provided with the coating film according to the first embodiment of the present invention, in which the reference symbol 1 denotes a stainless steel plate (base) which constitutes a major portion of a chamber, and 2 denotes a dense layer containing silicon dioxide ($SiO_2$) as a principal component, which is formed on the surface of the stainless steel plate 1.

This dense layer 2 covers the surface of the stainless steel plate 1 and is obtained by heat-treating a solution containing perhydropolysilazane and polyorganosilazane in air or air containing water vapor, a ratio of the content of perhydropolysilazane to the total amount of polysilazane including perhydropolysilazane and polyorganosilazane being from 0.65 to 0.95. The dense layer has flexibility to some extent, in addition to the density.

The perhydropolysilazane has at least a Si—H bond in a molecule and is a chain polymer obtained by chain linkage of a skeleton represented by the following chemical formula (1):

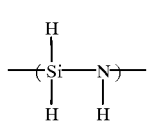

(1)

as a repeating unit, or a cyclic polymer obtained by cyclic linkage of the skeleton.

The polyorganosilazane is a chain polymer obtained by chain linkage of a skeleton represented by the following chemical formula (2):

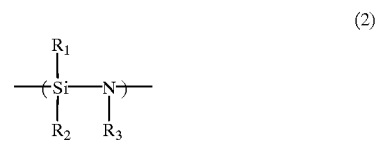

(2)

wherein R1, R2, and R3 each independently represent any one of a hydrogen atom, an alkyl group, an alkoxy group, an alkylsilyl group, an alkylamino group, a cycloalkyl group, an alkenyl group and an allyl group, and at least one of R1, R2, and R3 is an alkyl group, as a repeating unit, or a cyclic polymer obtained by cyclic linkage of the skeleton.

Preferred polyorganosilazane is polyorganosilazane wherein R1 is an alkyl group and R2 and R3 are hydrogen atoms, and a methyl group is particularly preferred among the alkyl group.

The other preferred structure of the dense layer 2 includes, for example, a dense and glassy $SiO_2$ layer obtained by heat-treating a block or random copolymer having a repeating unit represented by the following chemical formula (3):

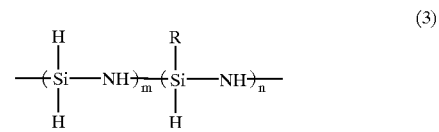

(3)

wherein R represents an alkyl group such as a methyl group, ethyl group or propyl group, and m+n represents a positive integer of 8 to 54 and m/(m+n) is from 0.65 to 0.95, in air or air containing water vapor.

The relationship between each content of perhydropolysilazane and polyorganosilazane and the density will now be described.

The layer obtained by forming a simple substance of perhydropolysilazane into a film on a stainless steel plate and heat-treating in air or air containing water vapor is a layer which has the highest density and is extremely dense.

The layer obtained by forming a simple substance of polyorganosilazane into a film on a stainless steel plate and heat-treating in air or air containing water vapor is a layer which has the lowest density and is flexible because it has an organic group.

Therefore, the density of the layer can be controlled between the density of the extremely dense layer and that of the extremely flexible layer by continuously changing each content of perhydropolysilazane and polyorganosilazane in the mixed solution.

Accordingly, the density can be represented based on the content ($0 \leq Ch \leq 1$) of perhydropolysilazane relative to the total amount of polysilazane including perhydropolysilazane and polyorganosilazane or the content Co ($=1-Ch$) of polyorganosilazane relative to the total amount of polysilazane including perhydropolysilazane and polyorganosilazane.

One example wherein the density is classified based on the content (Ch) of perhydropolysilazane relative to the total amount of polysilazane is shown below.

| Content of Perhydropolysilazane (Ch) | Density | Classification symbol of film quality |
|---|---|---|
| 1.00–0.95 | densest layer | A0 |
| 0.95–0.90 | dense layer A | A1 |
| 0.90–0.80 | dense layer B | A2 |
| 0.80–0.65 | dense layer C | A3 |
| 0.65–0.40 | flexible layer | B1 |
| 0.40–0 | most flexible layer | B0 |

Hereinafter, the classification symbol of the film quality is used.

According to the above description, to impart both the density and flexibility to the dense layer 2, the ratio of the content of perhydropolysilazane to that of polyorganosilazane in the solution to be heat-treated, that is, the ratio of the content of perhydropolysilazane to the total amount of polysilazane including perhydropolysilazane and polyorganosilazane, is preferably from 0.65 to 0.95, and is more preferably from 0.8 to 0.9.

The reason is as follows. When the ratio of the content of perhydropolysilazane to the total amount of polysilazane exceeds 0.95, flexibility is lost because the hardness is too high. On the other hand, when the ratio of the content of perhydropolysilazane to the total amount of polysilazane is less than 0.65, the flexibility is enhanced, and at the same time, the density is drastically reduced.

A glassy $SiO_2$ layer made from a mixture of perhydropolysilazane and polyorganosilazane or a perhydropolysilazane-polyorganosilazane copolymer is a dense film which is hard and strong and is also superior in adhesion to a stainless steel plate 1 and in corrosion resistance.

Since a stainless steel chamber having this dense $SiO_2$ layer as the dense layer 2 is obtained by forming the dense layer 2 having both the density and flexibility on the stainless steel plate 1, cracks are less likely to occur. The surface of the stainless steel plate 1 is coated with the dense layer 2, and therefore, the surface is not likely to be oxidized by a high-concentration oxidizing gas. Not only the oxidation resistance, but also the corrosion resistance and gas permeation resistance are improved.

The method of producing a stainless steel chamber according to this embodiment will now be described.

The surface of the stainless steel plate 1 on which the dense layer 2 is formed is previously washed with water to remove deposits, and is then washed with an organic solvent and is dried before being subjecting to a degreasing treatment.

A coating solution for forming a dense layer, which contains perhydropolysilazane and polyorganosilazane as a starting material of the dense layer 2, is prepared.

This coating solution is prepared by dissolving each predetermined amount of perhydropolysilazane and polyorganosilazane in an organic solvent, a ratio of the content of perhydropolysilazane to the total amount of polysilazane including perhydropolysilazane and polyorganosilazane being adjusted within a range from 0.65 to 0.95.

The organic solvent may be any organic solvent which does not exert a deleterious influence on the reaction of the polysilazane, and examples thereof include aromatic compounds such as benzene, toluene, xylene, ethylbenzene, diethylbenzene, trimethylbenzene and triethylbenzene; cycloparaffins such as cyclobutane, cyclohexane and cycloheptane; saturated hydrocarbon compounds such as n-pentane, i-pentane, n-hexane, i-hexane, n-heptane, i-heptane, n-octane, i-octane, n-nonane, i-nonane, n-decane and i-decane; and ethers such as dipropyl ether and dibutyl ether.

The resulting coating solution is applied on the stainless steel plate 1 by a dipping method, and is then dried. Examples of the coating method include a spin coating method, spray coating method, brush coating method, electrodeposition coating method, gravure roll coating method, bar coating method, and flow coating method, in addition to the dipping method, described above. An optimum method may be selected according to the shape and size of the stainless steel plate 1.

Then, the stainless steel plate 1 coated with the coating solution is heat-treated at a temperature within a range from 80 to 400° C. in air, or air containing water vapor, for 30 to 180 minutes.

This coating solution is vitrificated after the thermal decomposition in the heat treatment process to form a dense layer 2 containing $SiO_2$ as a principal component.

In this heat treatment process, when the reaction of perhydropolysilazane or polyorganosilazane proceeds in an initial stage of the heat treatment, a polymer having a Si—N bond, a Si—H bond, and a Si—R bond, in addition to a Si—O bond, is formed. In this stage, since a siloxane bond (Si—O—Si) is not sufficiently formed, conversion into ceramic is not sufficiently attained.

When the heat treatment proceeds further, oxidation and hydrolysis due to water vapor of the reaction product proceeds by the reaction between the polymer and water or oxygen to form a siloxane bond (Si—O—Si) or a Si—N bond, thus forming a ceramic having flexibility to some extent, in addition to density.

As described above, according to the stainless steel chamber of this embodiment, since the dense layer 2 having both the density and flexibility, which contains $SiO_2$ as a principal component, was formed on the surface of the stainless steel plate 1 constituting a major portion of the chamber, it becomes possible to prevent cracks from occurring at the surface and to prevent oxidation due to a high-concentration oxidizing gas. Not only the oxidation resistance, but also the corrosion resistance and gas permeation resistance can be improved.

According to the method of producing the stainless steel chamber of this embodiment, since the surface of the stainless steel 1 is coated with the coating solution containing perhydropolysilazane and polyorganosilazane, each content of which is adjusted to a predetermined value, and the coated stainless steel is then heat-treated in air or air containing water vapor, it becomes possible to easily produce a stainless steel chamber having excellent oxidation resistance, corrosion resistance, and gas permeation resistance without a fear of cracks and a fear of oxidation due to a high-concentration acidic substance, and without using a special apparatus. Also, the cost is relatively low.

Second Embodiment

Figure 2:
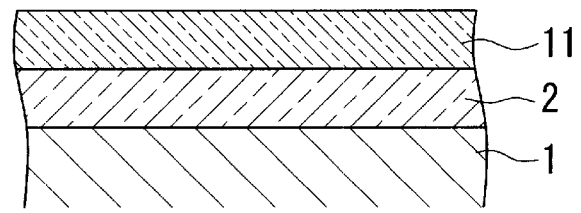
FIG. 2 is a partial cross sectional view showing a stainless steel chamber provided with the coating film according to the second embodiment of the present invention.

FIG. 2 is a partial cross sectional view showing a stainless steel chamber (member) provided with the coating film as the second embodiment of the present invention, and the stainless steel chamber of this embodiment is different from the stainless steel chamber of the first embodiment in that a flexible layer 11 is further formed on the dense layer 2 of the first embodiment.

In this stainless steel chamber, the resulting coating film has a two-layer structure of the dense layer 2 and the flexible layer 11.

This flexible layer 11 is obtained by heat-treating a solution containing perhydropolysilazane and polyorganosilazane in air or air containing water vapor, and has density to some extent, in addition to the flexibility.

To impart both the flexibility and density to the flexible layer 11, a ratio of the content of perhydropolysilazane to the total amount of polysilazane including perhydropolysilazane and polyorganosilazane is preferably from 0 to 0.65, and more preferably from 0.4 to 0.65. The reason is as follows. When the ratio of the content of perhydropolysilazane to the total amount of polysilazane exceeds 0.65, the density is enhanced, and at the same time, the flexibility is reduced.

The other preferred structure of the flexible layer 11 includes, for example, a $SiO_2$ layer having the flexibility obtained by heat-treating a block or random copolymer having a repeating unit represented by the following chemical formula (3):

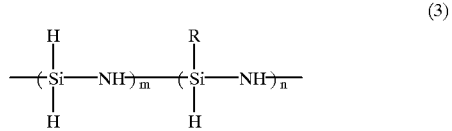

(3)

wherein R represents an alkyl group such as a methyl group, ethyl group or propyl group, and m+n represents a positive integer of 8 to 54 and m/(m+n) is from 0 to 0.65, in air or air containing water vapor.

The method of producing a stainless steel chamber according to this embodiment will now be described.

The description of the processes from the process of washing the surface of the stainless steel plate 1 through the process of forming the dense layer 2 are omitted because the method of producing the stainless steel chamber is the same as that of the first embodiment.

To form the flexible layer 11 on the dense layer 2, a coating solution for forming a flexible layer (second solution) containing perhydropolysilazane and polyorganosilazane as a starting material of the flexible layer 11, the content of polyorganosilazane being larger than that of the coating solution for forming a dense layer, is prepared.

This coating solution is prepared by dissolving each predetermined amount of perhydropolysilazane and polyorganosilazane in an organic solvent, the ratio of the content of perhydropolysilazane to the total amount of polysilazane including perhydropolysilazane and polyorganosilazane being preferably adjusted within a range from 0 to 0.65, and particularly preferably from 0.4 to 0.65. As the organic solvent, those used in the method of the first embodiment may be used.

The resulting coating solution is applied on the dense layer 2 by a dipping method, and is then dried. An optimum method may be selected according to the shape and size of the dense layer 2, similarly to the first embodiment.

Then, the stainless steel plate 1, the dense layer 2 of which is coated with the coating solution, is heat-treated at a temperature within a range from 80 to 400° C. in air or air containing water vapor for 30 to 180 minutes.

This coating solution is vitrificated after the thermal decomposition in the heat treatment process to form a flexible layer 11 containing $SiO_2$ as a principal component.

Although this heat treatment process is almost the same as that of the first embodiment, since the content of polyorganosilazane in the coating solution is large, the proportion of the siloxane bond (Si—O—Si) or Si—N bond is lower than that of the first embodiment. As a result, the frequency of the occurrence of cracks in the resulting ceramics is lower than that in the case of a dense layer.

As described above, according to the stainless steel chamber of this embodiment, since the dense layer 2 containing $SiO_2$ as a principal component was formed on the surface of the stainless steel plate 1, it becomes possible to prevent oxidation due to a high-concentration oxidizing gas. The flexible layer 11 containing $SiO_2$ as a principal component was formed on the surface of the dense layer 2, and therefore, it becomes possible to relieve stress caused by a difference in thermal expansion coefficient with the stainless steel plate 1 or deformation and to prevent cracks from occurring at the surface. The stainless steel plate 1 and the dense layer 2 can be protected by increasing the thickness of the flexible layer 11.

According to the method of producing the stainless steel chamber in this embodiment, since the surface of the dense layer 2 is coated with the coating solution containing perhydropolysilazane and polyorganosilazane, the content of polyorganosilazane being larger than that of the coating solution for forming a dense layer, and the coated dense layer is then heat-treated in air or air containing water vapor, it becomes possible to exert the same effects as those exerted in the method of producing the stainless steel chamber of the first embodiment.

Moreover, stress caused by a difference in thermal expansion coefficient with the stainless steel plate 1 or deformation is relieved, thereby making it possible to easily produce a stainless steel chamber wherein the stainless steel plate 1 and the dense layer 2 are protected.

Third Embodiment

Figure 3:
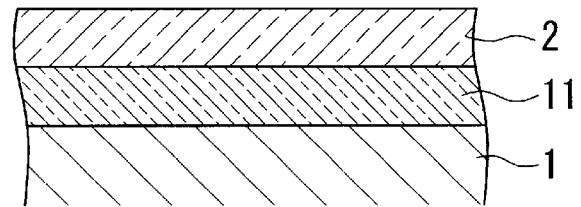
FIG. 3 is a partial cross sectional view showing a stainless steel chamber provided with the coating film according to the third embodiment of the present invention.

FIG. 3 is a partial cross sectional view showing a stainless steel chamber (member) provided with the coating film according to the third embodiment of the present invention, and the stainless steel chamber of this embodiment differs from the stainless steel chamber of the second embodiment in that a flexible layer 11 was formed directly on the stainless steel plate 1 and a dense layer 2 was formed on the flexible layer 11.

In this stainless steel chamber, the resulting coating film has a two-layer structure of the flexible layer 11 and the dense layer 2.

In the flexible layer 11, the ratio of the content of perhydropolysilazane to the total amount of polysilazane including perhydropolysilazane and polyorganosilazane is preferably from 0 to 0.65.

In the dense layer 2, the ratio of the content of perhydropolysilazane to the total amount of polysilazane including perhydropolysilazane and polyorganosilazane is preferably adjusted within a range from 0.65 to 1.0.

According to the stainless steel chamber of this embodiment, since the flexible layer 11 and the dense layer 2 were formed in order on the stainless steel plate 1, it becomes possible to impart flexibility and to relieve stress caused by a difference in thermal expansion coefficient with the stainless steel plate 1 or deformation and to prevent cracks from occurring on the surface by laminating the flexible layer 11 directly on the stainless steel plate 1. Furthermore, it becomes possible to protect the stainless steel plate 1 and to further relieve stress of the dense layer 2 by increasing the thickness of the flexible layer 11.

Fourth Embodiment

Figure 4:
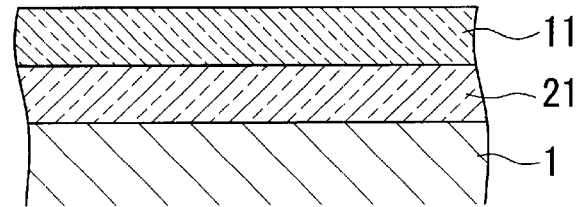
FIG. 4 is a partial cross sectional view showing a stainless steel chamber provided with the coating film according to the fourth embodiment of the present invention.

FIG. 4 is a partial cross sectional view showing a stainless steel chamber (member) provided with the coating film according to the fourth embodiment of the present invention, and the stainless steel chamber of this embodiment is different from the stainless steel chamber of the second embodiment in that a dense layer 21 containing perhydropolysilazane and polyorganosilazane, a ratio of the content of perhydropolysilazane to the total amount of polysilazane including perhydropolysilazane and polyorganosilazane being from 0.95 to 1.0, is formed directly on the stainless steel plate 1 and a flexible layer 11 was formed on the dense layer 21.

In this stainless steel chamber, the resulting coating film has a two-layer structure of the dense layer 21 and the flexible layer 11.

This dense layer 21 covers the surface of the stainless steel plate 1 and is obtained by heat-treating a solution containing perhydropolysilazane and polyorganosilazane, a ratio of the content of perhydropolysilazane to the total amount of polysilazane including perhydropolysilazane and polyorganosilazane being from 0.95 to 1.0, in an atmosphere or an atmosphere containing steam, and has extremely excellent density.

The method of producing a stainless steel chamber according to this embodiment will now be described.

The description of the processes up to the process of washing the surface of the stainless steel plate 1 are omitted because the method of producing the stainless steel chamber is the same as those of the first to third embodiments.

To form the dense layer 21 on the stainless steel plate 1, a coating solution for forming a dense layer containing perhydropolysilazane and polyorganosilazane, a ratio of the content of perhydropolysilazane to the total amount of polysilazane including perhydropolysilazane and polyorganosilazane being from 0.95 to 1.0, as a starting material of the dense layer 21, is prepared.

The resulting coating solution is applied on the stainless steel plate 1 by a dipping method, and is then dried. This coating solution is vitrificated after the thermal decomposition in the heat treatment process to form a dense layer 21.

To form the flexible layer 11 on the dense layer 21, a coating solution for forming a flexible layer (second solution) containing perhydropolysilazane and polyorganosilazane, the content of perhydropolysilazane being greater than that of the coating solution for forming a dense layer, as a starting material of the flexible layer 11 is prepared.

This coating solution is prepared by dissolving each predetermined amount of perhydropolysilazane and polyorganosilazane in an organic solvent, a ratio of the content of perhydropolysilazane to the total amount of polysilazane including perhydropolysilazane and polyorganosilazane being adjusted within a range from 0 to 0.65, and particularly preferably from 0.4 to 0.65.

The resulting coating solution is applied on the dense layer 21 by a dipping method, and is then dried, similarly to the second embodiment. This coating solution is vitrificated after the thermal decomposition in the heat treatment process to form a flexible layer 11 containing $SiO_2$ as a principal component.

After the coating solution for forming a dense layer was applied and dried, or was further preheated at a temperature lower than the temperature at which the flexible layer 11 is formed, the coating solution for forming a flexible layer may be applied, dried, and then heat-treated.

According to the method of producing the stainless steel chamber according to this embodiment, since the surface of the dense layer 21 was formed on the stainless steel plate 1, it becomes possible to prevent oxidation due to a high-concentration oxidizing gas. The flexible layer 11 containing $SiO_2$ is a principal component on the dense layer 21, and therefore, it is made possible to relieve stress caused by a difference in thermal expansion coefficient with the stainless steel plate 1 or deformation and to prevent cracks from occurring at the surface. The stainless steel plate 1 and the dense layer 21 can be protected by increasing the thickness of the flexible layer 11.

According to the method of producing the stainless steel chamber according to this embodiment, since the surface of the dense layer 21 is coated with the coating solution containing perhydropolysilazane and polyorganosilazane, the content of polyorganosilazane being larger than that of the coating solution for forming a dense layer, and the coated dense layer is then heat-treated in air or air containing water vapor, it becomes possible to exert the same effects as those exerted in the method of producing the stainless steel chamber of the first and second embodiments.

Moreover, stress caused by a difference in thermal expansion coefficient with the stainless steel plate 1 or deformation is relieved, thereby making it possible to easily produce a stainless steel chamber wherein the stainless steel plate 1 and the dense layer 21 are protected.

The first to fourth embodiments will now be described in more detail by way of Examples 1 to 8 and Comparative Examples 1 and 2.

EXAMPLE 1

A coating solution for forming a dense layer, wherein each content of perhydropolysilazane and polymethylhydrosilazane was adjusted such that a ratio of the content of perhydropolysilazane to that of polymethylhydrosilazane becomes 0.85:0.15, was prepared and the resulting coating solution was applied on the surface of a stainless steel plate by a spin coating method, and was then heat-treated in an atmosphere at 300° C. for one hour to form a dense layer (film quality: A2) having a thickness of 0.8 µm.

EXAMPLE 2

A coating solution for forming a dense layer, wherein each content of perhydropolysilazane and polymethylhydrosilazane was adjusted such that a ratio of the content of perhydropolysilazane to that of polymethylhydrosilazane becomes 0.70:0.30, was prepared and the resulting coating solution was applied on the surface of a stainless steel plate by a spin coating method, and was then heat-treated in an atmosphere at 300° C. for one hour to form a dense layer (film quality: A3) having a thickness of 0.8 µm.

EXAMPLE 3

A coating solution for forming a dense layer, wherein each content of perhydropolysilazane and polymethylhydrosilazane was adjusted such that a ratio of the content of perhydropolysilazane to that of polymethylhydrosilazane becomes 0.85:0.15, was prepared and the resulting coating solution was applied on the surface of a stainless steel plate by a spin coating method, and was then heat-treated in an atmosphere at 300° C. for one hour to form a dense layer (film quality: A2) having a thickness of 0.8 µm.

A coating solution for forming a flexible layer, wherein each content of perhydropolysilazane and polymethylhydrosilazane was adjusted such that a ratio of the content of perhydropolysilazane to that of polymethylhydrosilazane becomes 0.50:0.50, was prepared and the resulting coating solution was applied on the dense layer (film quality: A2) by a spin coating method, and was then heat-treated in an atmosphere at 300° C. for one hour to form a flexible layer (film quality: B1) having a thickness of 0.8 µm.

As a result, a laminated film having a two-layer structure of the dense layer (film quality: A2) and the flexible layer (film quality: B1) was formed on the surface of the stainless steel plate. The laminated film had a thickness of 1.6 µm.

EXAMPLE 4

Perhydropolysilazane was applied on the surface of a stainless steel plate by a spin coating method, and was then heat-treated in an atmosphere at 300° C. for one hour to form the densest layer (film quality: A0) having a thickness of 0.8 µm.

A coating solution for forming a flexible layer, wherein each content of perhydropolysilazane and polymethylhydrosilazane was adjusted such that a ratio of the content of perhydropolysilazane to that of polymethylhydrosilazane becomes 0.60:0.40, was prepared and the resulting coating solution was applied on the densest layer (film quality: A0) by a spin coating method, and was then heat-treated in an atmosphere at 300° C. for one hour to form a flexible layer (film quality: B1) having a thickness of 0.8 µm.

As a result, a laminated film having a two-layer structure of the densest layer (film quality: A0) and the flexible layer (film quality: B1) was formed on the surface of the stainless steel plate. The laminated film had a thickness of 1.6 µm.

EXAMPLE 5

A coating solution for forming a flexible layer, wherein each content of perhydropolysilazane and polymethylhydrosilazane was adjusted such that a ratio of the content of perhydropolysilazane to that of polymethylhydrosilazane becomes 0.50:0.50, was prepared and the resulting coating solution was applied on the surface of a stainless steel plate by a spin coating method, and was then heat-treated in an atmosphere at 300° C. for one hour to form a flexible layer (film quality: B1) having a thickness of 0.8 µm.

A coating solution for forming a dense layer, wherein each content of perhydropolysilazane and polymethylhydrosilazane was adjusted such that a ratio of the content of perhydropolysilazane to that of polymethylhydrosilazane becomes 0.70:0.30, was prepared and the resulting coating solution was applied on the flexible layer (film quality: B1) by a spin coating method, and was then heat-treated in an atmosphere at 300° C. for one hour to form a dense layer (film quality: A3) having a thickness of 0.8 µm.

As a result, a laminated film having a two-layer structure of the flexible layer (film quality: B1) and the dense layer (film quality: A3) was formed on the surface of the stainless steel plate.

The laminated film had a thickness of 1.6 µm.

EXAMPLE 6

A perhydropolysilazane was mixed with silica fillers having an average particle diameter of 1 µm in a proportion of 0.3 g/cc and the resulting mixed solution was applied on the surface of a stainless steel plate by a spin coating method, and was then heat-treated in an atmosphere at 300° C. for one hour to form a dense layer (film quality: A0) having a thickness of 1.5 µm.

A coating solution for forming a flexible layer, wherein each content of perhydropolysilazane and polymethylhydrosilazane was adjusted such that a ratio of the content of perhydropolysilazane to that of polymethylhydrosilazane becomes 0.50:0.50, was prepared and the resulting coating solution was applied on the dense layer (film quality: A0) by a spin coating method, and was then heat-treated in an atmosphere at 300° C. for one hour to form a flexible layer (film quality: B1) having a thickness of 0.8 µm.

As a result, a laminated film having a two-layer structure of the dense layer (film quality: A0) and the flexible layer (film quality: B1) was formed on the surface of the stainless steel plate. The laminated film had a thickness of 2.3 µm.

EXAMPLE 7

Perhydropolysilazane was applied on the surface of a stainless steel plate by a spin coating method, and was then heat-treated in an atmosphere at 300° C. for one hour to form a dense layer (film quality: A0) having a thickness of 0.6 µm.

A coating solution for forming a dense layer, wherein each content of perhydropolysilazane and polymethylhydrosilazane was adjusted such that a ratio of the content of perhydropolysilazane to that of polymethylhydrosilazane becomes 0.70:0.30, was prepared and the resulting coating solution was applied on the dense layer (film quality: A0) by a spin coating method, and was then heat-treated in an atmosphere at 300° C. for one hour to form a dense layer (film quality: A3) having a thickness of 0.6 µm.

A coating solution for forming a flexible layer, wherein each content of perhydropolysilazane and polymethylhydrosilazane was adjusted such that a ratio of the content of perhydropolysilazane to that of polymethylhydrosilazane becomes 0.50:0.50, was prepared and the resulting coating solution was applied on the dense layer (film quality: A3) by a spin coating method, and was then heat-treated in an atmosphere at 300° C. for one hour to form a flexible layer (film quality: B1) having a thickness of 0.6 µm.

As a result, a laminated film having a three-layer structure of the dense layer (film quality: A0), the dense layer (film quality: A3) and the flexible layer (film quality: B1) was formed on the surface of the stainless steel plate. The laminated film had a thickness of 1.8 µm.

EXAMPLE 8

A coating solution for forming a dense layer, wherein each content of perhydropolysilazane and polymethylhydrosilazane was adjusted such that a ratio of the content of perhydropolysilazane to that of polymethylhydrosilazane becomes 0.80:0.20, was prepared and the resulting coating solution was applied on a stainless steel plate by a spin coating method, and was then heat-treated in air at 300° C. for one hour to form a dense layer (film quality: A2) having a thickness of 0.6 µm.

A coating solution for forming a flexible layer, wherein each content of perhydropolysilazane and polymethylhydrosilazane was adjusted such that a ratio of the content of perhydropolysilazane to that of polymethylhydrosilazane becomes 0.50:0.50, was prepared and the resulting coating solution was applied on the dense layer (film quality: A2) by a spin coating method, and was then heat-treated in air at 300° C. for one hour to form a flexible layer (film quality: B1) having a thickness of 0.6 µm.

A coating solution for forming a flexible layer, wherein each content of perhydropolysilazane and polymethylhydrosilazane was adjusted such that a ratio of the content of perhydropolysilazane to that of polymethylhydrosilazane becomes 0.30:0.70, was prepared and the resulting coating solution was applied on the flexible layer (film quality: B1) by a spin coating method, and was then heat-treated in an atmosphere at 300° C. for one hour to form a flexible layer (film quality: B0) having a thickness of 0.6 μm.

As a result, a laminated film having a three-layer structure of the dense layer (film quality: A2), the flexible layer (film quality: B1) and the flexible layer (film quality: B0) was formed on the surface of the stainless steel plate. The laminated film had a thickness of 1.8 μm.

COMPARATIVE EXAMPLE 1

Perhydropolysilazane was applied on the surface of a stainless steel plate by a spin coating method, and was then heat-treated in an atmosphere at 300° C. for one hour to form an inorganic silica layer (film quality: A0). The inorganic silica layer had a thickness of 0.8 μm.

COMPARATIVE EXAMPLE 2

Polymethylhydrosilazane was applied on the surface of a stainless steel plate by a spin coating method, and was then heat-treated in an atmosphere at 300° C. for one hour to form an organic silica layer (film quality: B0). The organic silica layer had a thickness of 0.8 μm. Table 1 and Table 2 show the results of the tests for evaluation of characteristics of Examples 1 to 8 and Comparative Examples 1 and 2.

TABLE 1

Heated in air at 400 for one hour

| | Presence/absence of cracks | Presence/absence of discoloration |
|---|---|---|
| Example 1 | ◎ | ◎ |
| Example 2 | ◎ | ◎ |
| Example 3 | ◎ | ◎ |
| Example 4 | ◎ | ◎ |
| Example 5 | ◎ | ○ |
| Example 6 | ◎ | ◎ |
| Example 7 | ◎ | ◎ |
| Example 8 | ◎ | ◎ |
| Comp. Example 1 | X | X |
| Comp. Example 2 | ◎ | X |

TABLE 2

Dipped in 10% hydrochloric acid solution for 24 hours

| | Presence/absence of corrosion |
|---|---|
| Example 1 | ○ |
| Example 2 | Δ |
| Example 3 | ◎ |
| Example 4 | ○ |
| Example 5 | ○ |
| Example 6 | ○ |
| Example 7 | ◎ |
| Example 8 | ◎ |
| Comp. Example 1 | X |
| Comp. Example 2 | X |

Table 1 shows the presence or absence of cracks on the surface as well as the presence of absence of discoloration of the surface of the base when heating in air at 400° C. for one hour (heating test), while Table 2 showed the presence or absence of corrosion when dipped in a 10% hydrochloric acid solution for 24 hours (dipping test).

The number of samples to be subjected to evaluation of characteristics was set to 20 with respect to each item.

Criteria for judgment in the evaluation of characteristics of the heating test and the dipping test are as follows.

(1) Heating Test
a. Presence or absence of cracks
◎: no abnormality was observed
○: microcracks were observed in some parts
Δ: cracks were observed in some parts
x: cracks were observed over the entire surface
b. Presence or absence of discoloration
◎: no discoloration was observed
○: slight discoloration was observed only in the vicinity of the end surface
Δ: slight discoloration was observed on the entire surface
x: discoloration was observed on the entire surface
(2) Dipping Test
Presence or absence of corrosion
◎: no abnormality was observed
○: partially damaged film was observed
Δ: partially peeled (disappeared) film was observed
x: completely peeled (disappeared) film was observed It was confirmed from Table 1 and Table 2, in Examples 1 to 8, that no cracks were observed or that microcracks were observed in some parts, and that slight discoloration (corrosion) of the surface was observed. It was confirmed that Examples 3, 7, and 8 exhibited satisfactory results in both "presence or absence of cracks" and "presence or absence of discoloration (corrosion)".

It was confirmed that Comparative Example 1 shows poor results in both the heating test and the dipping test. It was confirmed that, in Comparative Example 2, discoloration was observed over the entire surface in the heating test and that the film peeled off in the dipping test.

As described above, Comparative Examples 1 and 2 are inferior in characteristics to Examples 1 to 8.

Examples wherein the coating film of the present invention was applied to a metal member of a semiconductor manufacturing apparatus will now be described.

The metal member of the semiconductor manufacturing apparatus, to which the present invention is applied, is a metal member made of iron, stainless steel or aluminum which is more likely to be contacted directly with various reactive gases and corrosive gases or various treating solutions used in the semiconductor manufacturing process.

Specific examples of the metal members include inner walls of load-lock chambers, transfer chambers and processing chambers, transport robots, gate valves, shutters, valves, regulators, pressure sensors, mass flow controllers and filters used in gas supply systems or exhaust systems, check valves and manifolds. Remarkable effects of improving the corrosion resistance can be anticipated by applying the present invention to bottles or bombs for storing corrosive gases and liquids.

The metal member is chamfered by rounding (R-machining) a ridgeline of the end of the surface and then coating the surface with a coating layer consisting of plural silica glass films having different physical film properties.

The reason the ridgeline of the edge of the metal member surface is preferably rounded will now be described.

In the case in which the ridgeline of the edge is not rounded, the resulting coating film has a portion with a larger thickness than that of the flat portion along the ridgeline of the end. Therefore, cracks occur during the thermal decomposition of the coating film and corrosion occurs at the portion. In the case in which the ridgeline of the edge is rounded, a local change in thickness of the coating film is less likely to occur, thereby making it possible to prevent cracks from occurring.

In the case of rounding, the radius of curvature is preferably 0.2 or more. When the radius of curvature is less than 0.2, a uniform coating film cannot be obtained.

It is effective to subject the metal member to a pretreatment such as sand blasting treatment or glass bead blasting treatment. This sand blasting treatment is capable of smoothing sharp protrusions or unevenness on the surface of the metal member by using, as an abrasive, silicon carbide (SiC), alumina ($Al_2O_3$), or glass grains that have a cutting force sufficient for use as the abrasive, regardless of the value of the average surface roughness Ra.

The surface of the metal member includes unevenness such as process scratches formed during the turning process or cracks. When the metal member has severe surface unevenness, it becomes difficult to form a uniform film even if a polysilazane polymer solution of the present invention is converted into a silica glass film after coating, thereby causing the occurrence of pinholes and impairing the corrosion resistance.

Therefore, the smoother, the surface of the metal member, the better. The average surface roughness Ra is preferably 3.2 $\mu$m or less. When the average surface roughness of the surface of the metal member to be formed is greater than the above range, the adhesion of the film is improved if the sharp protrusions on the surface of the metal member are smoothed by polishing or are removed by grinding before forming a polysilazane film, thus improving the corrosion resistance.

Examples of the method of polishing the protrusion include mechanical polishing, electropolishing, buff polishing and chemical polishing methods. Among these polishing methods, a chemical polishing method is preferred because it can form a surface with the most desirable properties. The most preferred average surface roughness Ra is 1 $\mu$m or less.

The present invention has a feature that plural silica glass films having different physical film properties are laminated and formed on the surface of the metal member. The silica glass film can be formed by applying an organic solvent solution of polysilazane polymers represented by the chemical formulas (1) to (3) or a mixed solution of these polymers on the surface of the metal member as a base and heating the coated metal member in air or air with water vapor, thereby converting the solution into a silica glass.

The polysilazane polymer used in the present invention preferably has a number-average molecular weight within a range from 500 to 2500, and physical properties of the silica glass film produced by decomposing the polysilazane polymer vary widely with the starting material thereof.

The polysilazane polymer used in the present invention may be a block or random copolymer represented by the chemical formula (3) described previously, or a mixture of homopolymers represented by the chemical formulas (1) and (2).

In the above copolymer, when the content of the perhydrosilazane component increases, the resulting film has physical properties similar to those of the film obtained in the case of using perhydropolysilazane alone, thereby making it difficult to form a thick film. On the other hand, when the content of the alkylhydrosilazane component increases, the resulting silica glass film has an improved flexibility and a large thickness, but is inferior in corrosion resistance to the dense film.

In the present invention, a polysilazane polymer coating film having a thickness of 3 $\mu$m or more can be realized by mixing a polysilazane polymer solution with inorganic fillers. The inorganic filler is preferably a silica filler having a particle diameter of 1 $\mu$m or less. The amount thereof is preferably within a range from 0.1 to 0.4 g/cm$^3$ based on the resin solid content. When the amount is larger than the above range, the resulting coating layer becomes porous and is not suited for practical use. On the other hand, when the amount is smaller than the above range, a thick film cannot be formed.

The polysilazane polymer used in the present invention reacts with water in air, thereby converting into silicon oxide together with ammonia and hydrogen to form a silica glass film.

To thermally decompose the polysilazane polymer alone within a practical time, the heating temperature must be 450° C. or higher. However, the thermal decomposition reaction sufficiently proceeds at the heating temperature of 100° C. or less by modifying a portion of the polysilazane polymer, adding a catalyst, or thermally decomposing in air containing water vapor.

The heating time varies depending on the heating temperature, the presence or absence of a catalyst, and the partial pressure of water vapor, for example the curing process may be completed at a heating temperature of 400° C. within about 30 to 180 minutes.

The silica glass film of the present invention has a density of 2.1 to 2.2 g/cm$^3$ and a resistivity of about $10^{15}$ $\Omega$cm. The dense film has a pencil hardness of 9 H or more and a flexible film has a pencil hardness of 6 H.

The entire thickness of the coating layer including the silica glass film of the present invention is preferably within a range from 0.5 to 10 $\mu$m. When the thickness is less than 0.5 $\mu$m, a uniform film cannot be formed on the surface of the metal member and satisfactory effects of improving the corrosion resistance cannot be expected. Pitting is liable to occur in the coating layer and a contaminating gas is liable to accumulate, thereby causing contamination of the semiconductor manufacturing apparatus and lowering the corrosion resistance due to pitting or pinholes.

When the coating film is thin, particles in the working environment are incorporated into the coating film, and defects in the coating film are likely to occur, thereby causing deterioration of the corrosion resistance. To avoid deterioration of the corrosion resistance, the working environment must be clean, requiring a very large investment, and this is therefore not economical.

When the thickness of the coating layer is larger than 10 $\mu$m, it is difficult to form a film having a uniform thickness, thereby causing cracks, and this is therefore not preferred. Even if the thickness of the coating film is enhanced, the desired corrosion resistance is not improved, and this is therefore not economical.

The method of producing a metal member, to which the present invention is applied, will now be described.

The metal member, as the object to be coated, is previously formed into a predetermined shape, and then the ridgeline of the end of the surface is rounded by a well-known method to form a curved surface. The ridgeline to be rounded must be at least the ridgeline of the end of the surface which is in contact with a corrosive atmosphere. And preferably, all ridgelines are rounded.

The surface of the metal member is washed with an organic solvent to remove oil, and it is then sufficiently dried. A coating solution is prepared by dissolving a polysilazane polymer in an organic solvent and the resulting coating solution is applied on the surface of the metal member.

The thickness of the coating solution is preferably controlled to a value, e.g., 120 to 200%, of the desired thickness of the silica glass film. When the coating film is dried and heated, thereby converting the polysilazane polymer into a silica glass, shrinkage occurs thereby, reducing the thickness of the film. Accordingly, it is necessary to set the thickness of the coating film within the above range with respect to the desired thickness of the silica glass film.

The coating film is dried and is then subjected to the heating reaction. In this case, the reaction can be carried out at low temperature by using a catalyst.

The thermal decomposition reaction of the polysilazane is caused by contacting with water, and this water may be water in the air, or the reaction may be carried out by using a humidified furnace. The temperature for curing with heating is within a range from 200 to 350° C. The humidity required for the reaction is within a range from 0.1 to 100% RH. A coating consisting of plural silica glass films of the present invention can be formed by carrying out the step of forming the coating film and the step of heating the coating film to convert into the silica glass film plural times.

The embodiments wherein the coating film of the present invention is applied to the metal member of the semiconductor manufacturing apparatus will now be described.

Fifth Embodiment

Figure 5:
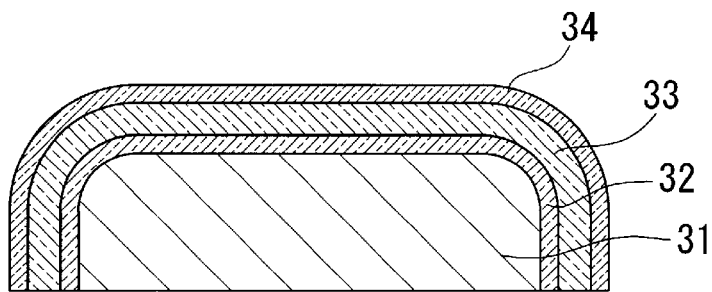
FIG. 5 is a cross sectional view showing a metal member according to the fifth embodiment of the present invention.

FIG. 5 is a cross sectional view showing the metal member according to the fifth embodiment of the present invention, in which the reference symbol 31 denotes a metal member base and a ridgeline of the end thereof is chamfered by rounding (R-machining). On the metal member base 31, a thin-wall dense silica glass film 32, a flexible silica glass film 33, and a thin-wall dense silica glass film 34 are laminated in order.

More specifically, a dense silica glass film 32 having a thickness of 0.5 $\mu$m or less, and preferably 0.2 $\mu$m or less, is formed on a metal member base 31 having an average surface roughness Ra of about 3.2 $\mu$m or less. Then, a flexible silica glass film 33 having almost the same thickness as the surface roughness is formed. Finally, a dense silica glass film 34 having a thickness of about 0.5 $\mu$m is formed on the surface thereof.

As described above, a coating film layer having a three-layer structure of the thin-wall dense silica glass film 32, the flexible silica glass film 33, and the thin-wall dense silica glass film 34 is formed on the metal member base 31.

In this structure, the dense silica glass film 32 contacted directly with the surface of the metal member base 31 is discontinuous at the peaked portion of the surface of the metal member base 31 but has good adhesion with the metal surface. When the flexible silica glass film 33 is formed thereon, the film as the lower layer exerts a so-called anchoring effect, thereby improving the adhesion of the entire coating and improving the peel strength. Furthermore, a coating layer having excellent resistance to oxidation at high temperature and corrosion can be realized because of the dense silica glass film 34 as the outermost layer.

With such a construction, an intermediate silica glass film can also be formed between the flexible silica glass film 33 and the dense silica glass film 34 as the surface layer. When such an intermediate silica glass film is formed, the adhesion between the flexible silica glass film 33 and the dense silica glass film 34 is improved and the adhesion and the peel strength of the entire layer are improved.

Sixth Embodiment

Figure 6:
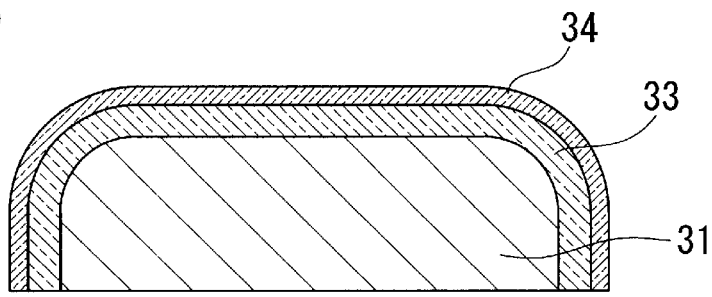
FIG. 6 is a cross sectional view showing a metal member according to the sixth embodiment of the present invention.

FIG. 6 is a cross sectional view showing the metal member according to the sixth embodiment of the present invention, and on a metal member base 31, a flexible silica glass film 33 and a thin-wall dense silica glass film 34 are laminated in order from the surface of the metal member base 31.

More specifically, a flexible silica glass film 33 having almost the same thickness as the surface roughness is formed on the surface of the metal member base 31 having an average surface roughness of 3.2 $\mu$m or less. Then, a thin-wall dense silica glass film 34 having a thickness of about 0.5 $\mu$m is formed on the surface thereof.

With such a construction, the flexible silica glass film 33 capable of having a comparatively large thickness formed on the surface of the metal member base 31 smoothens the unevenness on the surface of the metal member base 31, thereby making it possible to form a dense silica glass film 34 having a uniform thickness. With such a construction, it becomes possible to realize a coating film suited for practical use, wherein cracks are not caused by heating to 300° C. This layer construction is also superior in resistance to corrosion at normal temperature.

Seventh Embodiment

Figure 7:
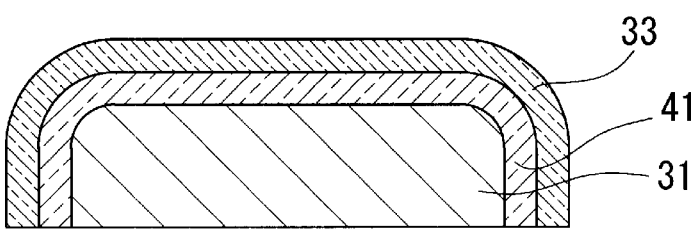
FIG. 7 is a cross sectional view showing a metal member according to the seventh embodiment of the present invention.

FIG. 7 is a cross sectional view showing the metal member according to the seventh embodiment of the present invention, and on a metal member base 31, a thick-wall dense silica glass film 41 and a flexible silica glass film 33 are laminated in order from the surface of the metal member base 31.

More specifically, a dense film forming polysilazane solution is applied on the surface of a metal member base 31 having an average surface roughness Ra of 3.2 $\mu$m or less so that a silica glass has a thickness of 2 to 3 $\mu$m after conversion, and then the dense film forming polysilazane solution is dried and is partially cured by heating to low temperature to form a thick-wall dense silica glass film 41. Then, a flexible film forming polysilazane polymer solution is applied on the surface thereof, is dried, and is converted into a flexible silica glass film 33 by heat treatment.

With such a construction, it becomes possible to realize a coating layer wherein cracks do not occur. Since the dense silica glass film 33 as the outermost layer imparts excellent cushioning properties and has a function of protecting the dense silica glass film 41 from thermal shocks, it becomes possible to realize a coating layer having excellent durability.

Eighth Embodiment

Figure 8:
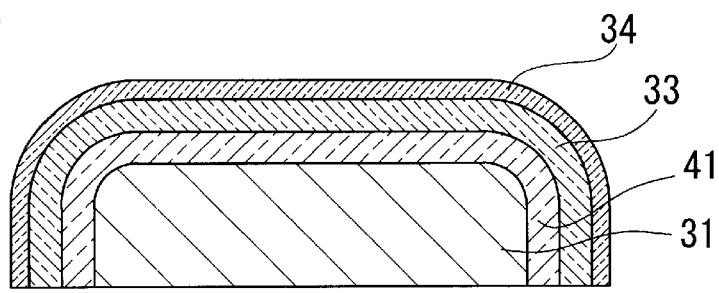
FIG. 8 is a cross sectional view showing a metal member according to the eighth embodiment of the present invention.

FIG. 8 is a cross sectional view showing the metal member according to the eighth embodiment of the present invention, and on a metal member base 31, a thick-wall dense silica glass film 41, a flexible silica glass film 33, and a thin-wall dense silica glass film 34 are laminated in order from the surface of the metal member base 31.

More specifically, a dense film forming polysilazane solution is applied on the surface of a metal member base 31 having an average surface roughness Ra of 3.2 $\mu$m or less, and then the dense film forming polysilazane solution is dried and is partially cured by heating at low temperature to form a dense silica glass film 41. A flexible film forming polysilazane polymer solution is applied on the surface thereof, and after drying, a dense film forming polysilazane is applied thereon and these polysilazane polymer solutions are converted into a flexible silica glass film 33 and a thin-wall dense silica glass film 34 by a heat treatment.

With such a construction, it becomes possible to realize a coating layer having excellent corrosion resistance and durability because of the large thickness of the dense silica glass film 41.

The present invention will now be described in more detail by way of Examples 11 to 13 and Comparative Examples 11 and 12.

EXAMPLE 11

A xylene solution containing 20% by weight of a perhydrosilazane-methylhydrosilazane copolymer, wherein m/(m+n) is 0.8, was applied on the surface of a stainless steel plate (20 mm×20 mm×2t, average surface roughness Ra: 3.2 μm) wherein the entire ridgeline of the end was chamfered by rounding (R=0.2) by a spin coating method, and then heated in air at 220° C. for one hour to form a dense silica glass film having a thickness of 0.5 μm.

On the resulting film, a xylene solution containing 20% by weight of a perhydrosilazane-methylhydrosilazane copolymer, wherein m/(m+n) is 0.25, was applied by a spin coating method, and was then heated in air at 300° C. for two hours to form a flexible silica glass film having a thickness of 2.0 μm.

On the resulting film, a xylene solution containing 20% by weight of perhydrosilazane was applied by a spin coating method, and was then heated in air at 320° C. for one hour to form a dense silica glass film having a thickness of 0.5 μm.

The coating layer of the resulting sample plate had a thickness of 3 μm.

EXAMPLE 12

First, a xylene solution containing 20% by weight of a perhydrosilazane-methylhydrosilazane copolymer, wherein m/(m+n) is 0.8, was applied on the surface of a stainless steel plate (20 mm×20 mm×2t, average surface roughness Ra: 3.2 μm) wherein the entire ridgeline of the end was chamfered by rounding (R=0.2) by a spin coating method, and was dried by standing in air for one hour. A xylene solution containing 20% by weight of a perhydrosilazane-methylhydrosilazane copolymer, wherein m/(m+n) is 0.2, was applied thereon by a spin coating method, and was then dried in air at 320° C. for one hour. Thus, a coating layer was formed consisting of a dense silica glass layer having a thickness of 2.5 μm, which is contacted with the surface of the metal, and a flexible silica glass film having a thickness of 3 μm, which is contacted with the dense silica glass layer.

The resulting coating layer had a thickness of 5.5 μm.

EXAMPLE 13

First, a xylene solution containing 20% by weight of a perhydrosilazane-methylhydrosilazane copolymer, wherein m/(m+n) is 0.7, was applied on the surface of a stainless steel plate (20 mm×20 mm×2t, average surface roughness Ra: 3.2 μm) wherein the entire ridgeline of the end was chamfered by rounding (R=0.2) by a spin coating method, and was dried by standing in air for one hour.

A xylene solution containing 20% by weight of a perhydrosilazane-methylhydrosilazane copolymer, wherein m/(m+n) is 0.25, was applied thereon by the same spin coating method, and was then dried in air at 320° C. for one hour. Thus, a coating layer consisting of a dense silica glass layer having a thickness of 2.5 μm, which is contacted with the surface of the metal, and a flexible silica glass film having a thickness of 3 μm, which is contacted with the dense silica glass layer, were formed.

A xylene solution containing 20% by weight of a perhydrosilazane-methylhydrosilazane copolymer, wherein m/(m+n) is 0.9, was applied thereon by the same spin coating method, and was then dried in air at 320° C. for one hour. As a result, a dense silica glass film having a thickness of 0.3 μm was formed.

The resulting coating layer had a thickness of 5.8 μm.

COMPARATIVE EXAMPLE 11

A stainless steel plate (20 mm×20 mm×2t, average surface roughness Ra: 3.2 μm) wherein the entire ridgeline of the end was chamfered by rounding (R=0.2) was prepared and was used as a sample.

EVALUATION

With respect to the metal members obtained in Examples 11 to 13 and Comparative Example 11, a heating test of heating in air at 300° C. for three hours and a dipping test of dipping in a 10% hydrochloric acid solution for 24 hours were carried out. The results are shown in Table 3 and Table 4.

TABLE 3

Heated in air at 300° C. for three hours

| | Presence/absence of cracks | Presence/absence of discoloration |
|---|---|---|
| Example 11 | ◎ | ◎ |
| Example 12 | ◎ | ◎ |
| Example 13 | ◎ | ◎ |
| Comp. Example 11 | — | X |

TABLE 4

Dipped in 10% hydrochloric acid solution for 24 hours

| | Presence/absence of cracks | Presence/absence of corrosion |
|---|---|---|
| Example 11 | ◎ | ◎ |
| Example 12 | ◎ | ◎ |
| Example 13 | ◎ | ◎ |
| Comp. Example 11 | — | X |

Criteria for judgment in evaluation of characteristics of the heating test and dipping test are the same as those in Examples 1 to 8 and Comparative Examples 1 and 2.

As is apparent from the results of Table 3 and Table 4, discoloration of the surface, occurrence of cracks and peeling of the film were not observed in Examples 11 to 13. On the other hand, corrosion was promoted on the entire surface of the sample in Comparative Example 11 wherein a surface coating layer was not formed.

The respective embodiments of the coating film, the member provided with the coating film and the method of producing the coating film according to the present invention were described with reference to the accompanying drawings, but the specific construction is not limited to the embodiments described above and design variation can be carried out without departing from the gist of the present invention.

For example, although the stainless steel plate was used as the base, various metal members such as a metal plate, other than the stainless steel plate, various plastic members such as a plastic plate, various ceramic members such as a ceramic plate, and various natural members such as wood, paper, shell, bone, and precious stones can be appropriately used, if necessary.

As the adhesion improved layer, for example, a plating layer made of various metals such as chromium (Cr), nickel (Ni), platinum (Pt), and palladium (Pd), ceramic metallized film, and organic film such as silicon varnish or heatless glass can be appropriately used, if necessary.

What is claimed is:

1. A coating film, formed on at least a portion of a base, comprising:
    a dense layer containing silicon dioxide as a principal component, which is obtained by heat-treating a solution containing perhydropolysilazane and polyorganosilazane, a ratio of the content of perhydropolysilazane and polyorganosilazane being from 0.65 to 0.95; and
    a second layer containing silicon dioxide as a principal component formed on the dense layer, the second layer being obtained by heat treating a second solution containing perhydropolysilazane and polyorganosilazane, the content of polyorganosilazane being larger than that of the solution.

2. A coating film as claimed in claim 1, further comprising an adhesion improved layer formed between the base and the dense layer.

3. A coating film as claimed in claim 1, further comprising a third layer containing silicon dioxide as a principal component formed on the second layer, the third layer being obtained by heat-treating a third solution containing perhydropolysilazane and polyorganosilazane, the content of polyorganosilazane being smaller than that of the second layer.

4. A coating film as claimed in claim 1, wherein the second layer comprises a laminate of plural layers containing silicon dioxide as a principal component obtained by separately heat-treating plural solutions having different contents of polyorganosilazane.

5. A coating film as claimed in claim 1, wherein the base comprises a material selected from the group consisting of a metal, ceramic and a synthetic resin.

6. A coating film, formed on at least a portion of a base, comprising:
    a dense layer containing silicon dioxide as a principal component, which is obtained by heat-treating a solution containing perhydropolysilazane and polyorganosilazane, a ratio of the content of perhydropolysilazane to the total amount of polysilazane including perhydropolysilazane and polyorganosilazane being from 0.95 to 1.0; and
    a second layer containing silicon dioxide as a principal component formed on the dense layer, the second layer being obtained by heat-treating a second solution containing perhydropolysilazane and polyorganosilazane, the content of polyorganosilazane being larger than that of the solution.

7. A coating film as claimed in claim 6, further comprising a third layer containing silicon dioxide as a principal component formed on the second layer, the third layer being obtained by heat-treating a third solution containing perhydropolysilazane and polyorganosilazane, the content of polyorganosilazane being less than that of the second layer.

8. A coating film as claimed in claim 6, wherein the second layer comprises a laminate of plural layers containing silicon dioxide as a principal component obtained by separately heat-treating plural solutions having different contents of polyorganosilazane.

9. A coating film as claimed in claim 6, further comprising an adhesion improved layer formed between the base and the dense layer.

10. A coating film as claimed in claim 6, wherein the base comprises a material selected from the group consisting of a metal, ceramic, and a synthetic resin.

11. A coating film, formed on at least a portion of a base, comprising:
    a flexible layer containing silicon dioxide as a principal component, which is obtained by heat-treating a solution containing perhydropolysilazane and polyorganosilazane, a ratio of the content of perhydropolysilazane to the total amount of polysilazane including perhydropolysilazane and polyorganosilazane being from 0 to 0.65; and
    a second layer containing silicon dioxide as a principal component formed on the flexible layer, the second layer being obtained by heat-treating a second solution containing perhydropolysilazane and polyorganosilazane, the content of polyorganosilazane being less than that of the solution.

12. A coating film as claimed in claim 11, wherein the flexible layer and/or the second layer comprise a laminate of plural layers containing silicon dioxide as a principal component obtained by separately heat-treating plural solutions having different contents of polyorganosilazane.

13. A coating film as claimed in claim 11, further comprising an adhesion improved layer formed between the base and the flexible layer.

14. A coating film as claimed in claim 11, wherein the base comprises a material selected from the group consisting of a metal, ceramic, and a synthetic resin.

* * * * *